(12) United States Patent
Hurwitz et al.

(10) Patent No.: US 8,997,342 B2
(45) Date of Patent: Apr. 7, 2015

(54) METHOD OF FABRICATION, A MULTILAYER ELECTRONIC STRUCTURE AND STRUCTURES IN ACCORDANCE WITH THE METHOD

(71) Applicant: Zhuhai Advanced Chip Carriers & Electronic Substrate Solutions Technologies Co. Ltd., Qianwu, Doumen, Zhuhai (CN)

(72) Inventors: Dror Hurwitz, Zhuhai (CN); Alex Huang, Qianwu Town (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 94 days.

(21) Appl. No.: 13/652,122

(22) Filed: Oct. 15, 2012

(65) Prior Publication Data

US 2014/0102765 A1    Apr. 17, 2014

(51) Int. Cl.
*H01K 3/22* (2006.01)
*H05K 1/02* (2006.01)
*H05K 3/00* (2006.01)
*H05K 3/46* (2006.01)

(52) U.S. Cl.
CPC ............. *H05K 1/0298* (2013.01); *H05K 3/0061* (2013.01); *H05K 3/4647* (2013.01); *H05K 2201/10378* (2013.01)

(58) Field of Classification Search
CPC ........................... H05K 3/0061; H05K 1/0298
USPC .................. 29/830–832, 841, 846, 848, 851; 156/154, 247; 174/258; 257/678; 264/272.11, 272.17
See application file for complete search history.

(56) References Cited

U.S. PATENT DOCUMENTS

| | | | | |
|---|---|---|---|---|
| 4,306,925 A | * | 12/1981 | Lebow et al. | 29/848 |
| 7,923,828 B2 | * | 4/2011 | Endo et al. | 257/678 |
| 8,262,970 B2 | * | 9/2012 | Morita et al. | 264/272.17 |

* cited by examiner

*Primary Examiner* — Donghai D Nguyen
(74) *Attorney, Agent, or Firm* — Wiggin and Dana LLP; Gregory S. Rosenblatt; Jonathan D. Hall

(57) ABSTRACT

A method of fabricating a multilayer electronic support structure comprising electroplating copper substructures, laying a dielectric pre-preg comprising a polymer resin over the copper substructures, and pressing to pressures of 200 to 600 PSI against a release film having a higher hardness than the resin of the prepreg but a lower hardness than the cured resin, and heating through a curing cycle while maintaining pressure.

16 Claims, 6 Drawing Sheets

METHOD OF FABRICATION, A MULTILAYER ELECTRONIC STRUCTURE AND STRUCTURES IN ACCORDANCE WITH THE METHOD

BACKGROUND

1. Field of the Invention

The present invention relates to multilayer electronic support structures such as interposers, and to methods of manufacturing of same.

2. Description of the Related Art

Driven by an ever greater demand for miniaturization of ever more complex electronic components, consumer electronics such as computing and telecommunication devices are becoming more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Of the various approaches for achieving these requirements, one widely implemented manufacturing technique that creates interconnecting vias between layers uses lasers to drill holes through the subsequently laid down dielectric substrate through to the latest metal layer for subsequent filling with a metal, usually copper, that is deposited therein by a plating technique. This approach to creating vias is sometimes referred to as 'drill & fill', and the vias created thereby may be referred to as 'drilled & filled vias'.

There are a number of disadvantages with the drilled & filled via approach. Since each via is required to be separately drilled, the throughput rate is limited, and the costs of fabricating sophisticated, multi-via IC substrates and interposers becomes prohibitive. In large arrays it is difficult to produce a high density of high quality vias having different sizes and shapes in close proximity to each other by the drill & fill methodology. Furthermore, laser drilled vias have rough side walls and taper inwards through the thickness of the dielectric material. This tapering reduces the effective diameter of the via. It may also adversely affect the electrical contact to the previous conductive metal layer especially at ultra small via diameters, thereby causing reliability issues. Additionally, the side walls are particularly rough where the dielectric being drilled is a composite material comprising glass or ceramic fibers in a polymer matrix, and this roughness may create additional stray inductances.

The filling process of the drilled via holes is usually achieved by copper electroplating. The electroplating deposition technique may result in dimpling, where a small crater appears at the top of the via. Alternatively, overfill may result, where a via channel is filled with more copper than it can hold, and a domed upper surface that protrudes over the surrounding material is created. Both dimpling and overfill tend to create difficulties when subsequently stacking vias one on top of the other, as required when fabricating high-density substrates and interposers. Furthermore, it will be appreciated that large via channels are difficult to fill uniformly, especially when they are in proximity to smaller vias within the same interconnecting layer of the interposer or IC substrate design.

Although the range of acceptable sizes and reliability is improving over time, the disadvantages described hereinabove are intrinsic to the drill & fill technology and are limit the effective range of fabricable via sizes. It will further be noted that laser drilling is best for creating round via channels. Although slot shaped via channels may be fabricated by laser milling, nevertheless, the range of drill & fill via geometries that may effectively be fabricated is somewhat limited. Fabrication of vias by drill & fill is expensive and it is difficult to evenly and consistently fill the via channels created thereby with copper using the relatively, cost-effective electroplating process.

Laser drilled vias in composite dielectric materials are practically limited to $60 \times 10^{-6}$ m diameter, and even so suffer from significant tapering shape as well as rough side walls due to the nature of the composite material drilled, in consequence of the ablation process involved.

In addition to the other limitations of laser drilling as described hereinabove, there is a further limitation of the drill & fill technology in that it is difficult to create different diameter vias in the same layer, since when different sized via channels are drilled and then filled with metal to fabricate different sized vias, the via channels fill up at different rates. Consequently, the typical problems of dimpling or overfill that characterize drill & fill technology are exasperated, since it is impossible to simultaneously optimize deposition rates for different sized vias.

An alternative solution that overcomes many of the disadvantages of the drill & fill approach, is to fabricate vias by depositing copper or other metal into a pattern created in a photo-resist, using a technology otherwise known as 'pattern plating'.

In pattern plating, a seed layer is first deposited. Then a layer of photo-resist is deposited thereover and subsequently exposed to create a pattern which is selectively removed to make trenches that expose the seed layer. Via posts are created by depositing Copper into the trenches in the photo-resist. The remaining photo-resist is then removed, the seed layer is etched away, and a dielectric material that is typically a polymer impregnated glass fiber mat, is laminated thereover and therearound to encase the vias posts. Various techniques and processes can be then use to thin down the dielectric material, planarizing it and exposing the tops of the via posts allowing conductive connection to a ground or reference plane thereby, for building up the next metal layer thereupon. Subsequent layers of metal conductors and via posts may be deposited thereonto, by repeating the process to build up a desired multilayer structure.

In an alternative but closely linked technology, known hereinafter as 'panel plating', a continuous layer of metal or alloy is deposited onto a substrate. A layer of photo-resist is deposited on top of this and a pattern is developed therein, and the pattern of developed photo-resist is stripped away, selectively exposing the metal thereunder, which may then be etched away. The undeveloped photo-resist protects the underlying metal from being etched away, and leaves a pattern of upstanding features and vias. After stripping away the undeveloped photo-resist, a dielectric material, such as a polymer impregnated glass fiber mat, may be laminated around and over the upstanding copper features and/or via posts.

The via layers created by pattern plating or panel plating methodologies such as those described above, are typically known as 'via posts' and feature layers from copper.

It will be appreciated that the general thrust of the microelectronic evolution is directed towards fabricating ever smaller, thinner and lighter and more powerful products having high reliability. Unfortunately, the use of thick cored interconnects prevents ultra-thin products being attainable. To create ever higher densities of structures in the interconnect IC substrate or interposer, ever more layers of ever smaller connections are required. Indeed, sometimes it is desirable to stack components on top of each other.

If plated, laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern or panel plated multilayer structures consisting of metal vias or features in a dielectric matrix. The metal may be copper, and the dielectric may be a fiber reinforced polymer. Typically, a polymer with a high glass transition temperature ($T_g$) is used, such as polyimide, for example. These interconnects may be cored or coreless, and may include cavities for stacking components. They may have odd or even numbers of layers. Enabling technology is described in previous patents issued to Amitec-Advanced Multilayer Interconnect Technologies Ltd. For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures. The method includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround, the first IC die being bondable onto the IC support, and the second IC die being bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "integrated circuit support structures and their fabrication" describes a method of fabricating an electronic substrate comprising the steps of; (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second hall stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

BRIEF SUMMARY

A first aspect of the invention is directed to providing an electronic support structure comprising layers of copper substructures laminated within a dielectric material comprising continuous glass fibers in a polymer matrix, characterized by the dielectric material being void free and the thickness of each dielectric material layer being controlled to within +−3 microns of a predetermined thickness, with a standard deviation of less than 1 micron.

Typically, the copper substructures comprises a layer of copper features and a layer of copper vias extending from the layer of copper features, wherein each dielectric material layer comprises both the layer of features and the layer of copper vias encapsulated within the dielectric material, and the thickness of each dielectric material layer being in the range of 20 microns to 60 microns.

Typically, adjacent dielectric layers have the same thickness +−3 microns.

Typically, the polymer matrix comprises a polymer resin selected from the group of thermosets and thermoplastics.

Typically, the polymer matrix further comprises inorganic fillers.

A second aspect of the invention is directed to an outer layer of a multilayer electronic support structure comprising copper substructures laminated in a dielectric comprising continuous glass fibers in polymer matrix characterized by the dielectric layer being void free and having a thickness in the range of 20 microns to 60 microns, wherein after curing and prior to further treatment said dielectric layer is characterized by a smooth upper surface, and covering highest copper substructures with a layer of dielectric not exceeding 10 microns.

Preferably, the highest copper substructures are copper via posts, and the layer of dielectric material covers ends of said via posts by not more than 10 microns.

A further aspect of the invention is directed to providing a method of fabricating a multilayer electronic support structure comprising electroplating copper substructures, laying a dielectric pre-preg comprising a polymer resin over the copper substructures, and pressing to pressures of 200 to 600 PSI against a release film having a higher hardness than the resin of the prepreg but a lower hardness than the cured resin, and heating through a curing cycle whilst maintaining pressure.

Typically, the copper substructures comprise via posts.

Typically the method is characterized by the cured resin having a highly planar surface covering upper ends of said via posts by less than 10 microns of cured resin.

Typically the release film comprises polyethylene tetrapthalate PET.

Preferably, the release film has a thickness of at least 25 μm.

Preferably, the release film has a thickness of not more than 75 μm.

In some embodiments, the release film is coated with silicone on at least one surface.

In some embodiments, the release film is coated with silicone on both surfaces.

In some embodiments, the copper substructures comprise a feature layer.

In some embodiments, the curing cycle comprises heating to a full cure temperature and maintaining at full cure temperature for 30 to 90 minutes.

In some embodiments, the curing cycle comprises heating to a partial cure temperature and maintaining for 30 to 90 minutes, cooling down and applying a thinning and smoothing procedure selected from mechanical, chemical and chemical mechanical processing, and then heating to a full cure temperature for 30 to 90 minutes.

Throughout, the term microns or μm refers to micrometers, or $10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings.

DETAILED DESCRIPTION

In the description hereinbelow, support structures consisting of metal vias in a dielectric matrix, particularly, copper via posts in a polymer matrix, such as polyimide or epoxy or BT (Bismaleimide/Triazine) or their blends, reinforced with glass fibers are considered.

Other embodiments use other thermoplastic or thermoset polymers.

Figure 1:
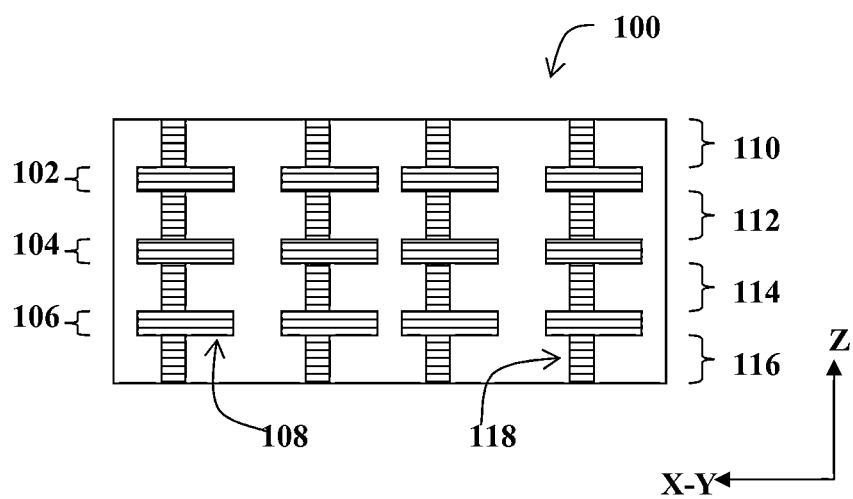
FIG. 1 is a simplified section through a multilayer composite support structure of the prior art.

FIG. 1 is a simplified section through a multilayer composite support structure of the prior art. As described in U.S. Pat. No. 7,682,972, U.S. Pat. No. 7,669,320 and U.S. Pat. No. 7,635,641, for example, multilayer support structures 100 of the prior art include functional layers 102, 104, 106 of components or features 108 separated by layers of dielectric 110, 112, 114, 116, which insulate the individual layers. Vias 118 through the dielectric layer provide electrical connection between features 108 in the adjacent functional or feature layers 102, 104, 106. Thus the feature layers 102, 104, 106 include features 108 generally laid out within the layer, in the X-Y plane, and vias 118 that conduct current across the dielectric layers 110, 112, 114, 116. Vias 118 are generally designed to have minimal inductance and are sufficiently separated to have minimum capacitances therebetween.

Figure 2:
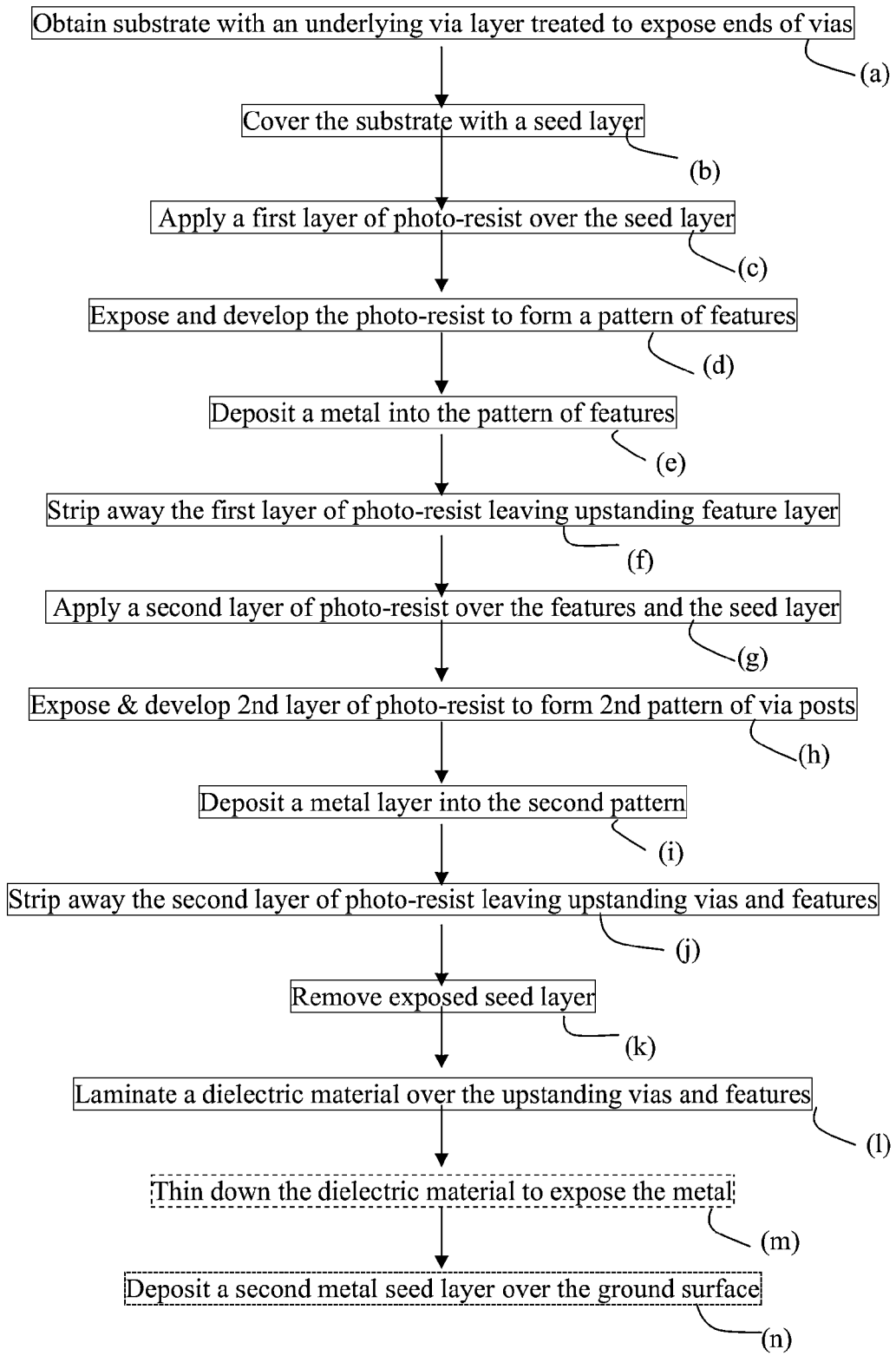
FIG. 2 is a flowchart of one general fabrication process.

With reference to FIG. 2, in some embodiments, a feature layer may be fabricated by the steps of: obtaining a substrate including an upper via layer in dielectric surround that is polished, thinned, planarized or otherwise treated to expose the copper thereof—step (a). The substrate with the exposed ends of the vias is covered with a seed layer that is typically copper—step (b). The seed layer is typically about 0.5 microns-1.5 microns thick and may be deposited by sputtering or by electroless plating, for example.

To aid adhesion, the seed layer may includes a first thin adhesion metal layer that may be fabricated from titanium, chrome or nickel-chrome, for example, and will typically have a thickness in the range of 0.04 microns to 0.1 microns. A layer of photo-resist is then deposited over the seed layer—step (c), and exposed to form a negative pattern of features—step (d). A metal, typically copper is deposited into the metal pattern, by electroplating or electroless plating—step (e) to fabricate a feature layer. The photo-resist layer is removed to leave the upstanding feature layer—step (f). Next, a second, deeper layer of photoresist is deposited over the seed layer and upstanding feature layer—step (g) and a pattern of vias posts including at least one trench having a long dimension in the X-Y plane that is at least 3 times as long as a short dimension in the X-Y plane is developed in the second deeper layer of photoresist—step (h). Copper is electroplated or electroless plated into the pattern in the second layer, deeper layer of photoresist to fabricate via posts and at least one non-cylindrical via post having a long dimension in the X-Y plane that is at least 3 times as long as a short dimension in the X-Y plane—step (i). The second layer of photoresist is now stripped away, leaving the via posts and the non-cylindrical via post having a long dimension in the X-Y plane that is at least 3 times as long as a short dimension in the X-Y plane upstanding—step (j). The seed layer is now removed—step (k) by exposing the structure to a wet etch of ammonium hydroxide or copper chloride, for example, and a layer of dielectric is now laminated over both the feature layer and the via layer—step (l). The dielectric material may then be thinned down—step (m) to expose the metal, by mechanical, chemical or chemical-mechanical grinding or polishing which also planarizes the top surface, and then a second metal seed layer may be depositing over the thinned surface—step (n).

The dielectric material may comprise a polymer, such as polyimide, epoxy, Bismaleimide, Triazine and blends thereof, which may include inorganic reinforcements, and typically includes glass fibers and ceramic particles. Indeed, the dielectric material is typically fabricated from a woven fiber prepreg impregnated with the polymer resin that includes ceramic particulate filler.

Figure 3:
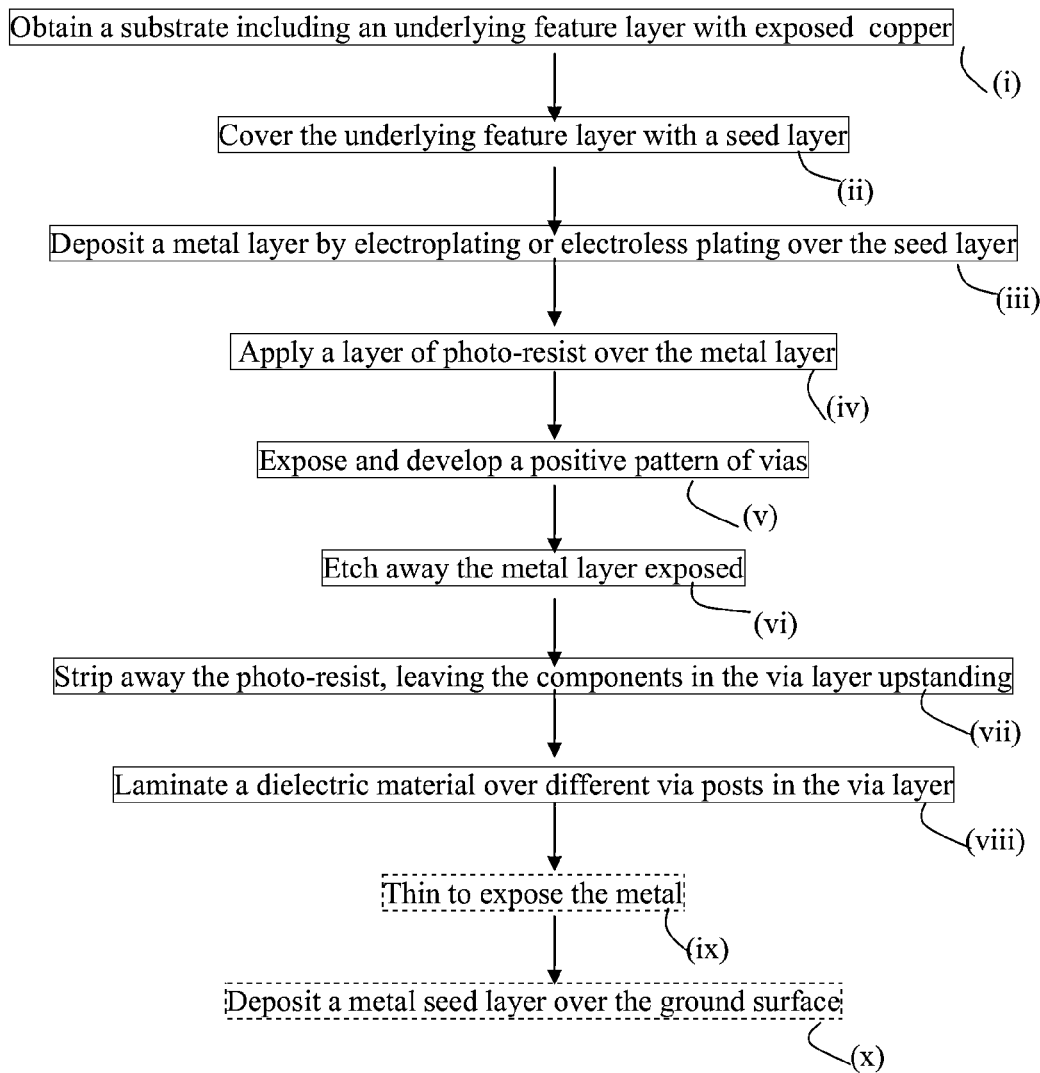
FIG. 3 is a flowchart of a second general fabrication process.

It will be appreciated that in addition to pattern plating described in FIG. 2, in an alternative method shown in FIG. 3 the at least one via layer is fabricated by the steps of: obtaining a substrate including an underlying feature layer with exposed copper—step (i). The underlying feature layer is covered with a seed layer—step (ii), typically copper. A metal layer, typically copper, is deposited, typically by electroplating or electroless plating over the seed layer—step (iii). A layer of photo-resist is depositing over the metal layer—step (iv) and a positive pattern of vias is developed—step (v). The metal layer exposed is etched away—step (vi). Where fabricated in copper, a wet copper etchant, such as ammonium hydroxide or copper chloride, may be used. The remaining photo-resist is stripped away—step (vii), leaving the at least one component in the via layer upstanding, and a dielectric material is laminated over the at least one component in the via layer—step (viii). To build up further layers, the dielectric may be thinned to expose the metal—step (ix) and then a metal seed layer may be deposited over the ground surface—step (x).

In both the methods described above, a layer of dielectric consisting of a fiber in resin pre-preg is laid over copper vias and then cured in a heated press to create a layer of dielectric covering the vias. To expose the ends of the vias and to ensure planarity for laying down further layers of features and vias to build up the structure, the dielectric material is thinned and planarized by mechanical, chemical or chemical mechanical processing CMP.

Figure 4:
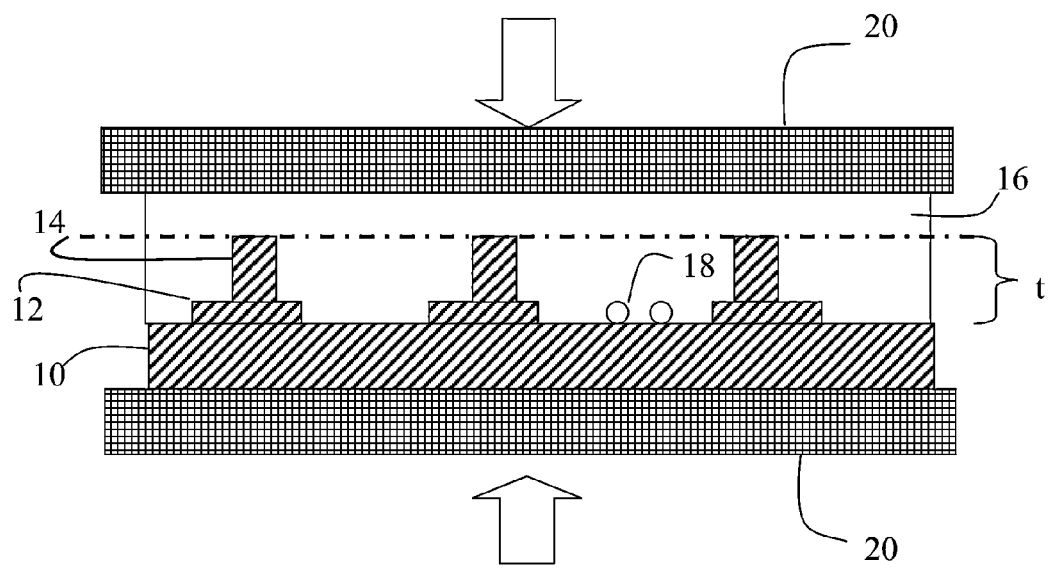
FIG. 4 is a schematic illustration of lamination against a hard surface.

With reference to FIG. 4, a substrate 10 with a feature layer 12 and via posts 14 covered with dielectric 16 is shown. The dielectric comprises continuous fibers in a polymer resin, and is provided as a pre-preg and hot pressed in a press 20 to cure the resin. It has been found that where the dielectric pre-preg material is pressed down directly by the hard surface of the press 20, the top surface of the dielectric 16 may be flat and the thickness of the dielectric 16 well controlled, but there is a tendency for voids 18 to form within the dielectric layer, typically at the interface with the substrate 10 (or underlying layer).

Figure 5:
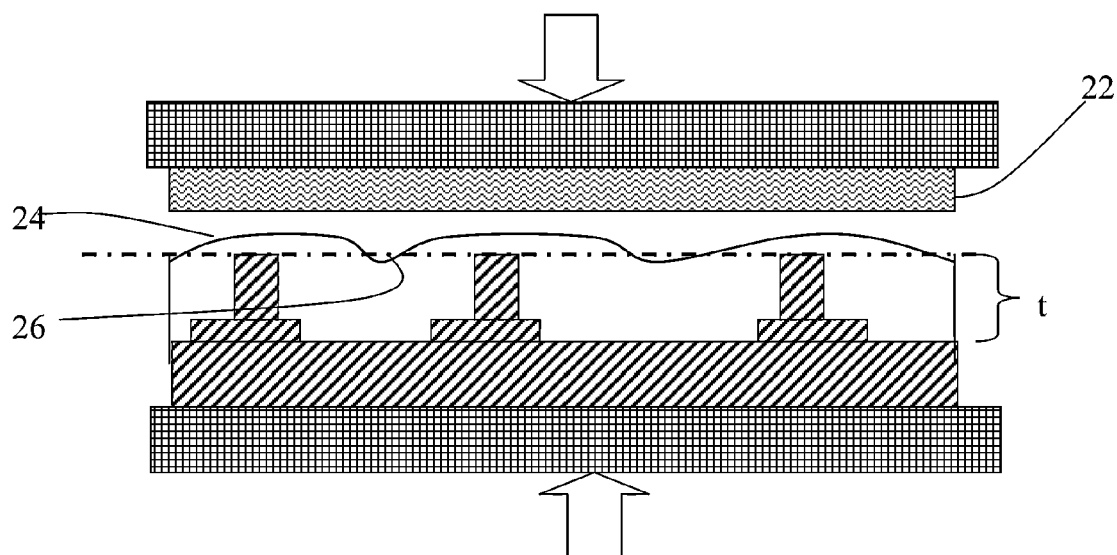
FIG. 5 is a schematic illustration of lamination against a soft surface.

With reference to FIG. 5, because the dielectric layer 16 is applied over a topography of features 12 or features 12 and via posts 14, where a softer release material 22 is interposed before the dielectric prepreg 16 and the press 20, the prepreg conforms around the copper features 12 and via posts 14 and the voids 18 are eliminated. However, the upper surface 24 of the dielectric layer 16 as formed tends to be wavy as it follows the underlying topography. This waviness needs to be removed prior to further build up, resulting in a less well known quantity of material that requires removing and difficulties in achieving a desired thickness. Furthermore, sometimes valleys 26 in the upper surface 24 of the dielectric layer 18 may dip below the desired thickness t, and so thinning to the desired thickness t results in the surface obtained including such valleys 26, which, to be eliminated, requires more material to be removed and the resulting thickness to be less than t, again creating difficulties in accurate thickness control. To overcome this, thick prepregs are used, but more material must then be removed to obtain the desired thickness t and to expose the ends of the via posts 14, requiring additional grinding and making it difficult to obtain a desired dielectric thickness t to high tolerances.

Thus whether a soft release layer is used or not it is difficult to avoid voids occurring and to obtain a smooth upper surface whilst controlling the thickness of the dielectric layer.

With both lamination techniques followed by grinding it has been found possible to obtain thickness control to +−10 microns, with a standard deviation of +−3 microns. Using drill and fill technology, where thinning and planarization are not required, the dielectric thickness can be controlled to +−7.5 microns, and so although drill & fill technology has other disadvantages, as far as dielectric thickness control is concerned, the drill & fill technology is advantageous.

With reference to FIG. 6, in the present invention, a double action press pad is used when laminating the dielectric material over a metal structure, which may be copper via posts and/or a copper feature layer. In one example, the double action press pad is fabricated from a polyester. A particularly useful polyester for this purpose is polyethylene terephalate PET, which in film form is typically BoPET (Biaxially-oriented polyethylene terephthalate). To prevent sticking to the prepreg and the press, usefully, the double action press pad is coated on one and preferably both surfaces with silicone.

BoPET (Biaxially-oriented polyethylene terephthalate) film has a high viscosity and is thermally stabilized. It is widely used for capacitators, graphics, film base and recording tapes etc.

Properties of polyethylene terephalate are provided in the table below.

| Young's modulus (E) | 2800-3100 MPa |
| Tensile strength($\sigma_t$) | 55-75 MPa |
| Elastic limit | 50-150% |
| notch test | 3.6 kJ/m$^2$ |
| Glass temperature | 75° C. |
| Vicat B | 170° C. |
| linear expansion coefficient ($\alpha$) | $7 \times 10^{-5}$/K |

Properties for Polyethylene terephthalate Film are provided in the table below:

| Property | | Value |
|---|---|---|
| Dielectric Strength @25 µm thick | kV mm$^{-1}$ | 300 |
| Dissipation Factor @1 MHz | | 0.016 |
| Elongation at Break | % | 60-165 |
| Initial Tear Strength | g µm$^{-1}$ | 18-54 |
| Permeability to Carbon Dioxide @25 C. | $\times 10^{-13}$ cm$^3 \cdot$ cm cm$^{-2}$ s$^{-1}$ Pa$^{-1}$ | 0.2 |
| Permeability to Hydrogen @25 C. | $\times 10^{-13}$ cm$^3 \cdot$ cm cm$^{-2}$ s$^{-1}$ Pa$^{-1}$ | 0.4 |
| Permeability to Nitrogen @25 C. | $\times 10^{-13}$ cm$^3 \cdot$ cm cm$^{-2}$ s$^{-1}$ Pa$^{-1}$ | 0.004 |
| Permeability to Oxygen @25 C. | $\times 10^{-13}$ cm$^3 \cdot$ cm cm$^{-2}$ s$^{-1}$ Pa$^{-1}$ | 0.03 |
| Permeability to Water @25 C. | $\times 10^{-13}$ cm$^3 \cdot$ cm cm$^{-2}$ s$^{-1}$ Pa$^{-1}$ | 100 |
| Permeability to Water @38 C. | $\times 10^{-13}$ cm$^3 \cdot$ cm cm$^{-2}$ s$^{-1}$ Pa$^{-1}$ | 150 |
| Specific Heat | kJ kg$^{-1}$ K$^{-1}$ | 1.3 |
| Thermal Conductivity @23 C. | W m$^{-1}$ K$^{-1}$ | 0.13-0.15 |

A commercially available material comprising PET coated with silicone on both sides, is available from Zacros, Fujimori Kogyo Co. LTD. Japan, and is available in various thicknesses. 25 µm thick Zacros film has been found to perform well, as have 50 µm and 75 µm thicknesses.

Figure 6A:
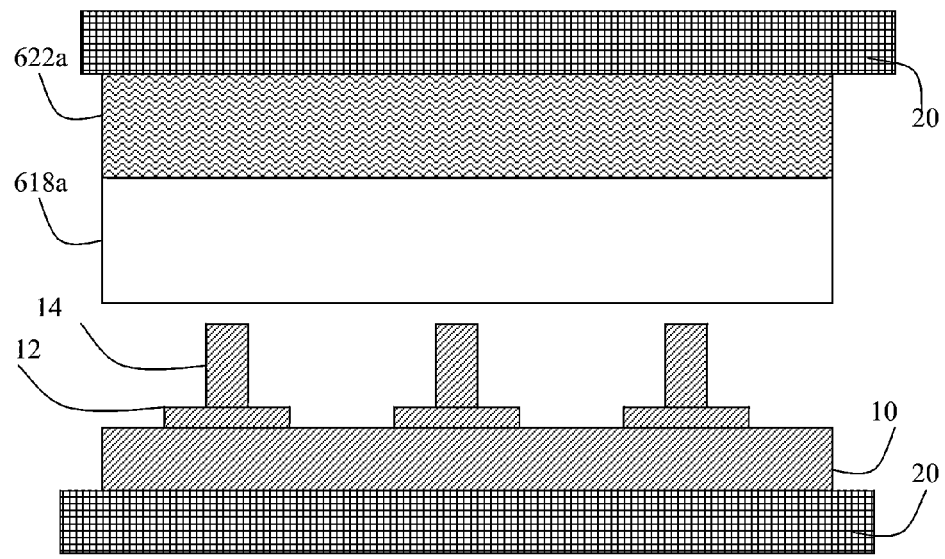
FIGS. 6a-c show a schematic illustration of lamination against a double action press pad.
Figure 6B:
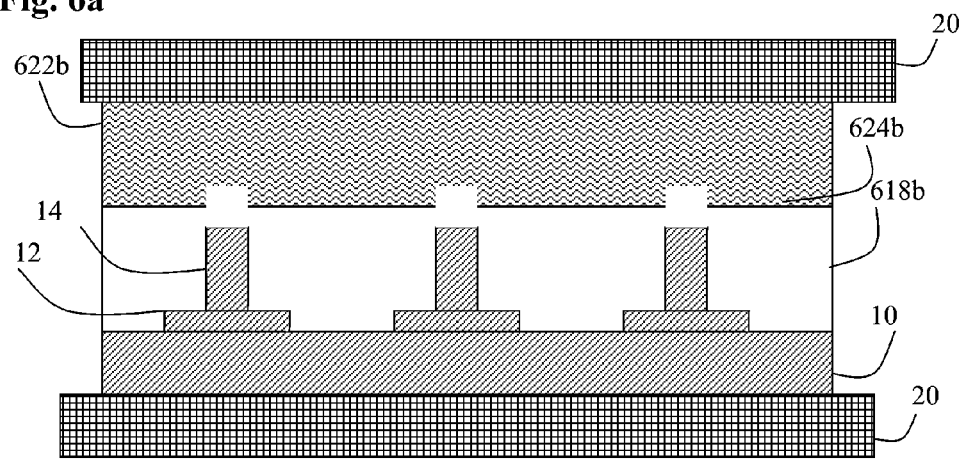

Essentially, with reference to FIG. 6a, the dielectric pre-preg 618a is laid over a substrate 10, copper features 12 and via posts 14 and a double action press pad 622a is positioned over the pre-preg 618a and the press is closed at room temperature and at pressures of 250-500 psi. Referring to FIG. 6b, this cold pressing with conforming due to the double action press pad 622b being softer than the prepreg 618b removes voids, but results in the upper surface 624b of the prepreg 616b conforming to the underlying vias 14 and features 12 and a wavy if not crenellated upper surface 624b results. The press is then heated up to the cure temperature for 30 to 90 minutes to cure the polymer of the pre-preg 618b whilst maintaining the pressure. The ramp up in temperature may be anywhere from 1 degree per minute to 10 degrees per minute, depending on the resin of the pre-preg being used. Without wishing to be bound by any particular theory, it may be that the underlying explanation for the phenomenon is that the press pad 622a selected is harder than the polymer matrix of the pre-preg 618a but the warmed the press pad 622b is softer than the melted polymer 618b. Consequently, during the curing cycle as the polymer matrix of the prepreg softens 818a>618b, the viscoelastic press pad 622a>622b recovers from its deformation and flattens resulting in the press pad 622c and prepreg 618c shown in FIG. 6c. In this manner, a void free dielectric layer 616c encapsulating the copper plated topography is achieved with a smooth upper surface 624c and controllable thickness. Furthermore, the amount of dielectric deposited over the underlying copper structures may be less, so minimal material requires to be removed to expose the ends of those copper structures.

The cure temperatures of the prepreg are a function of the polymer resin used. For E705G glass fabric, where the matrix is a blend of epoxy and poly-imide, the cure temperature is 230° C. For epoxy or BT, the final cure temps may be 180° C. to 190° C. Where a larger amount of material needs to be removed to expose the ends of via posts, it has been found possible to partially cure the prepreg at an intermediate temperature and then to cool down, thin, and then reheat to the final cure temperature. For E705G glass fabric the intermediate temperature is in the range of 150° C. to 200° C. For other epoxies and BT, the partial cure may take place at 150° C. to 160° C.

By using the double action press pad approach, it has been found possible to deposit a void free dielectric layer that covers the underlying copper vias or features by less than 10 microns or even less than 5 microns of material to be subsequently removed. Since the amount of material to be removed is accurately known, it is possible to standardize the thinning procedure and to effectively control the dielectric thickness to +−3 microns with a standard deviation of less than 1 micron. This enables electronic substrates fabricated using the copper via approach to have dielectric thickness control that compares favorably to that obtained using the drill & fill approach.

Proof of Concept

The following results were obtained using 0.25 μm thick Zacros film.

Figure 6C:
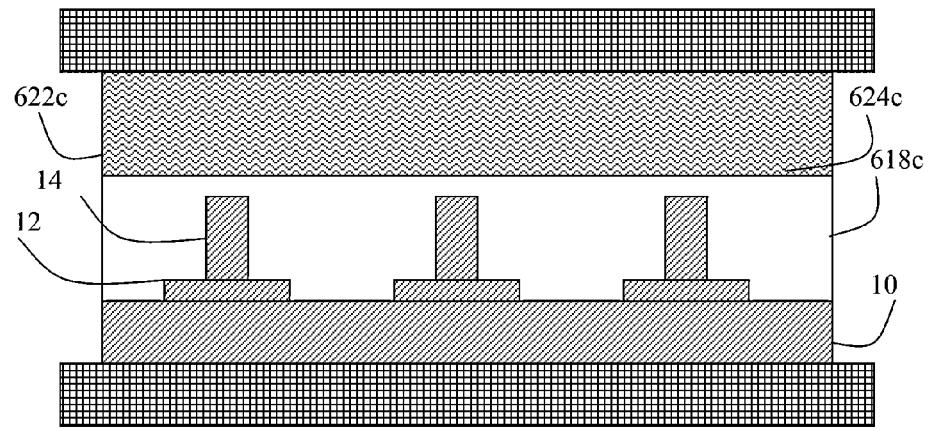
Figure 6D:
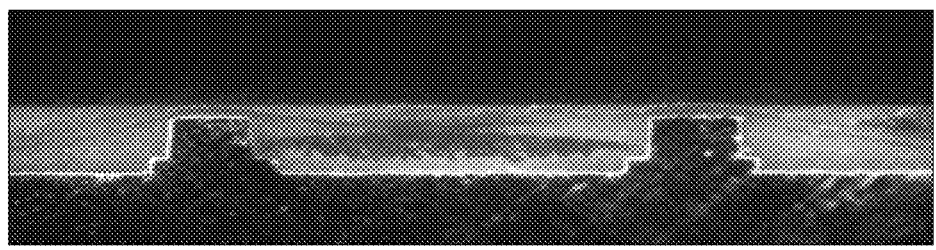
FIG. 6d is a photomicrograph showing the structure obtainable by the process of FIG. 6a-c.

FIG. 6d is a photomicrograph of a cross section of the structure obtainable by the method of FIG. 6a-c.

Figure 7A:
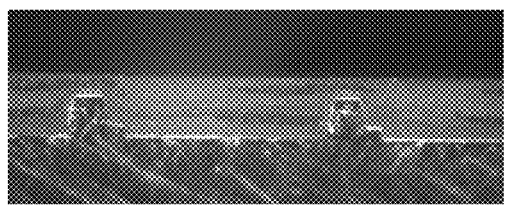
FIGS. 7a and 7b are microphotographs of the cross section through the dielectric over and around via pillars in both via pillar dense areas and via pillar sparse areas showing the void free, flat smooth dielectric material that is obtainable, with relatively little material needing to be removed to expose ends of copper via posts in one example.
Figure 7B:

FIGS. 7a and 7b are micro-photographs of cross-sections of pillar dense and pillar sparse areas of the structure. The dielectric was two layers of 1027 E705G glass fabric and the highest pressure was 250 psi. The thickness of the dielectric resin varied between 79.1 microns in the pillar dense area, to 80.8 microns in the pillar sparse areas, i.e. a variation of less than two microns. Over the via posts, the thickness of the dielectric layer varied between 26.8 microns in the pillar dense areas to 25.1 microns in the pillar sparse areas, again, a variation of less than two microns.

Figure 8A:
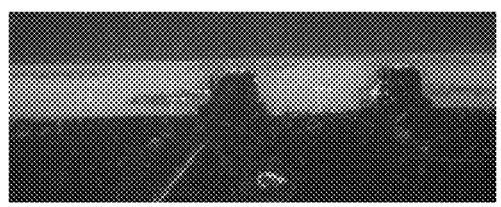
FIGS. 8a and 8b are microphotographs of the cross section through the dielectric over and around via pillars in both via pillar dense areas and via pillar sparse areas showing the void free, flat smooth dielectric material that is obtainable, with relatively little material needing to be removed to expose ends of copper via posts in another example.
Figure 8B:
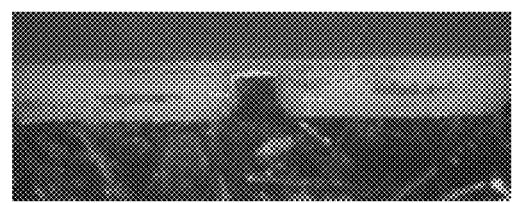

FIGS. 8a and 8b are micro-photographs of cross-sections of pillar dense and pillar sparse areas of the structure. The dielectric was two layers of E705G glass fabric but this time, one layer of 1017 and one layer of 1027. The highest pressure applied was 500 psi. The thickness of the dielectric resin varied between 74.3 microns in the pillar dense area, to 71.5 microns in the pillar sparse areas, i.e. a variation of less than two microns. Over the via posts, the thickness of the dielectric layer varied between 16.5 microns in the pillar dense areas to 17.9 microns in the pillar sparse areas, again, a variation of less than two microns.

Such laminated structures can be thinned down to expose the ends of the copper pillars by predetermined polishing regimes. For example, by applying an #800 ceramic brush at a pressure of 2 atmospheres and a speed of 2 meters per minute for 2 passes and at 3 meters a minute for one pass, both lay-ups resulted in a 38 micron thickness of dielectric with a standard deviation of 0.8, and a smooth upper surface.

It will be appreciated that the double press pad concept disclosed herein may be advantageously used when laminating copper features for subsequent drill & fill interconnection, and, although particularly advantageous for via post lamination, is not limited to use with via post technology.

It will be particularly appreciated that by using the double press pad concept, dielectric thickness can be maintained within a range of +−3 microns which is better than current state of the art control with drill & fill technology, Tighter tolerance is advantageous in improving electrical performance, due to better by impedance control.

Persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. A method of fabricating a multilayer electronic support structure comprising:
   electroplating copper substructures, laying a dielectric pre-preg comprising a polymer resin over the copper substructures,
   placing a release film, having a hardness that is higher than a hardness of the resin of the pre-preg and lower than a hardness of a cured resin, over the dielectric pre-preg
   pressing to pressures of 200 to 600 PSI against the release film, and heating through a curing cycle whilst maintaining pressure; wherein the curing cycle comprises heating to a partial cure temperature and maintaining for 30 to 90 minutes, cooling down and applying a thinning and smoothing procedure selected from mechanical, chemical and chemical mechanical processing, and then heating to a full cure temperature for 30 to 90 minutes.

2. The method of claim 1, wherein the copper substructures comprise via posts.

3. The method of claim 2, wherein the method is characterized by the cured resin having a highly planar surface covering upper ends of said via posts by less than 10 microns of cured resin.

4. The method of claim 1, wherein the release film comprises polyethylene tetrapthalate PET.

5. The method of claim 1 wherein the release film has a thickness of at least 25 μm.

6. The method of claim 1 wherein the release film has a thickness of not more than 75 μm.

7. The method of claim 1 wherein the release film is coated with silicone on at least one surface.

8. The method of claim 1 wherein the release film is coated with silicone on both surfaces.

9. The method of claim 1, wherein the copper substructures comprise a feature layer.

10. An electronic support structure fabricated from the method of claim 1 comprising layers of copper substructures laminated within a dielectric material comprising continuous glass fibers in a polymer matrix, characterized by the dielectric material being void free and the thickness of each dielectric material layer being controlled to within +/−3 microns of a predetermined thickness, with a standard deviation of less than 1 micron.

11. The electronic support structure of claim 10, wherein said copper substructures comprises a layer of copper features and a layer of copper vias extending from the layer of copper features, wherein each dielectric material layer comprises both the layer of features and the layer of copper vias encapsulated within the dielectric material, and the thickness of each dielectric material layer being in the range of 20 microns to 60 microns.

12. The electronic support structure of claim 10, wherein adjacent dielectric layers have the same thickness +/−3 microns.

13. The electronic support structure of claim 1, wherein the polymer matrix comprises a polymer resin selected from the group of thermosets and thermoplastics.

14. The electronic support structure of claim 13, wherein the polymer matrix further comprises inorganic fillers.

15. The electronic support structure of claim 13, wherein the outer dielectric layer is void free and has a thickness in the range of 20 microns to 60 microns, and after curing and prior to further treatment said dielectric layer is characterized by a smooth upper surface, and covering highest copper substructures with a layer of dielectric not exceeding 10 microns.

16. The electronic support structure of claim 13 wherein said highest copper substructures are copper via posts, and the layer of dielectric material covers ends of said via posts by not more than 10 microns.

* * * * *